United States Patent
Shalvi et al.

(10) Patent No.: US 7,466,575 B2
(45) Date of Patent: Dec. 16, 2008

(54) MEMORY DEVICE PROGRAMMING USING COMBINED SHAPING AND LINEAR SPREADING

(75) Inventors: Ofir Shalvi, Ra'anana (IL); Naftali Sommer, Rishon Le-Zion (IL)

(73) Assignee: Anobit Technologies Ltd., Herzilia (IL)

( * ) Notice: Subject to any disclaimer, the term of this patent is extended or adjusted under 35 U.S.C. 154(b) by 0 days.

(21) Appl. No.: 11/995,811

(22) PCT Filed: May 10, 2007

(86) PCT No.: PCT/IL2007/000581

§ 371 (c)(1),
(2), (4) Date: Jan. 15, 2008

(87) PCT Pub. No.: WO2007/132458

PCT Pub. Date: Nov. 22, 2007

(65) Prior Publication Data

US 2008/0198652 A1   Aug. 21, 2008

Related U.S. Application Data

(60) Provisional application No. 60/867,399, filed on Nov. 28, 2006, provisional application No. 60/822,236, filed on Aug. 13, 2006, provisional application No. 60/747,106, filed on May 12, 2006.

(51) Int. Cl.
*G11C 27/00* (2006.01)
(52) U.S. Cl. ............ 365/45; 365/185.03; 365/191
(58) Field of Classification Search .......... 365/45, 365/185.03, 191
See application file for complete search history.

(56) References Cited

U.S. PATENT DOCUMENTS

| 4,910,706 | A | * | 3/1990 | Hyatt ............... 365/45 |
| 5,479,170 | A | | 12/1995 | Cauwenberghs et al. |
| 5,838,832 | A | * | 11/1998 | Barnsley ............. 382/249 |
| 6,134,631 | A | * | 10/2000 | Jennings, III .......... 711/117 |
| 6,212,654 | B1 | | 4/2001 | Lou et al. |
| 6,307,776 | B1 | | 10/2001 | So et al. |

(Continued)

FOREIGN PATENT DOCUMENTS

WO   WO 2007132453 A2 *  11/2007

OTHER PUBLICATIONS

Bez et al., "Introduction to Flash Memory," Proceedings of the IEEE, vol. 91, No. 4, Apr. 2003, pp. 489-502.

(Continued)

*Primary Examiner*—Van Thu Nguyen
*Assistant Examiner*—Alexander Sofocleous
(74) *Attorney, Agent, or Firm*—Darby & Darby PC

(57) ABSTRACT

A method for data storage includes accepting data for storage in a memory (28) that includes multiple analog memory cells (32). The data is converted to input values. The input values are filtered using a non-linear filtering operation to produce respective shaped values, and the shaped values are converted to output values using a linear spreading transformation with coefficients chosen so that each of the shaped values contributes to at least two of the output values. The non-linear filtering operation is selected so as to reduce a size of an output range in which the output values lie. The output values are stored in the respective analog memory cells.

29 Claims, 3 Drawing Sheets

U.S. PATENT DOCUMENTS 6,397,364 B1    5/2002    Barkan
6,467,062 B1    10/2002   Barkan
7,266,026 B2 *  9/2007    Gongwer et al. ............ 365/201

OTHER PUBLICATIONS

Eitan et al., "Multilevel Flash Cells and their Trade-Offs," Proceedings of the 1996 IEEE International Electron Devices Meeting (IEDM)5 New York, New York, pp. 169-172.

Eitan et al., "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pp. 522-524.

Maayan et al., "A 512Mb NROM Flash Data Storage Memory with 8MB/s Data Rate," Proceedings of the 2002 IEEE International Solid-State Circuits Conference (ISSCC 2002), San Francisco, California, Feb. 3-7, pp. 100-101.

Kim and Koh, "Future Memory Technology including Emerging New Memories," Proceddings of the 24 International Conference on Microelectronics (MIEL 2004), Nis, Serbia, and Montenegro, May 16-19, 2004, vol. 1, pp. 377-384.

Shalvi et al., "Signal Codes," The 2003 IEEE Information Theory Workshop (ITW2003), Paris, France, Mar. 31-Apr. 14, 2003.

* cited by examiner

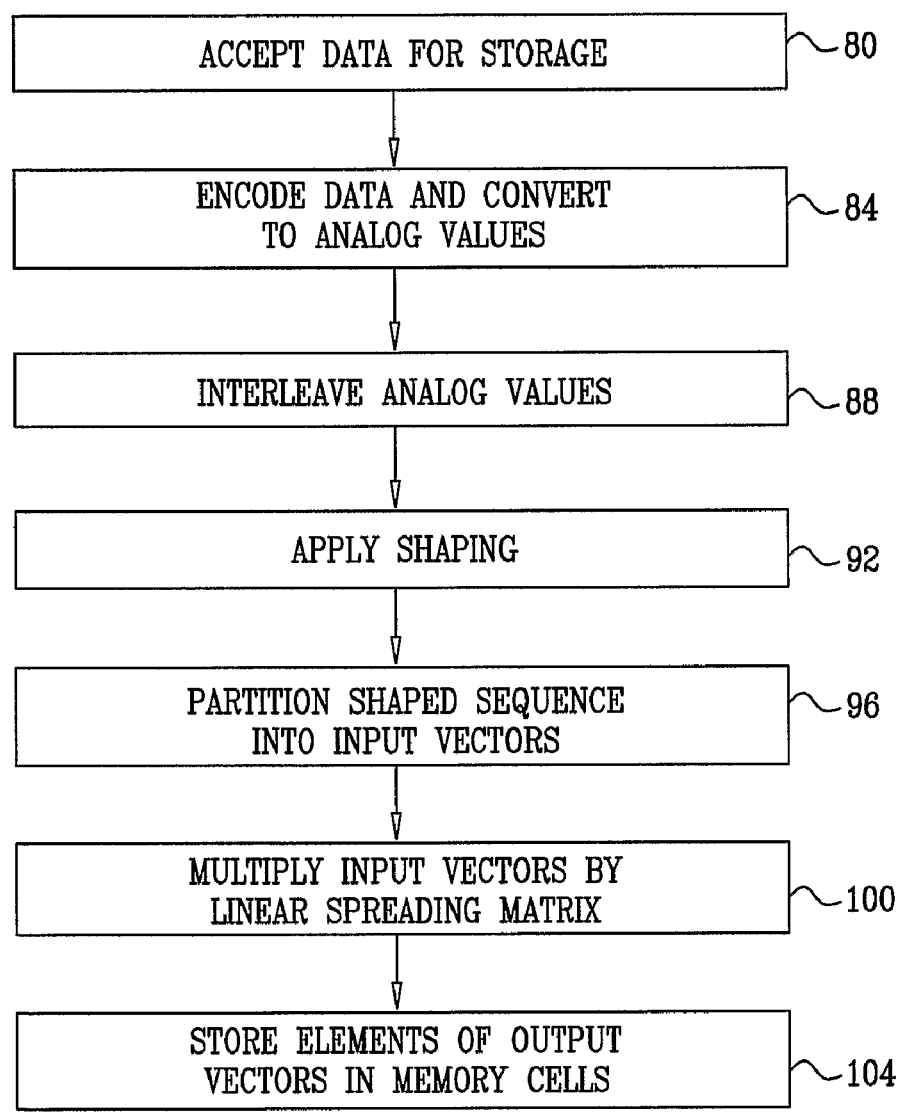

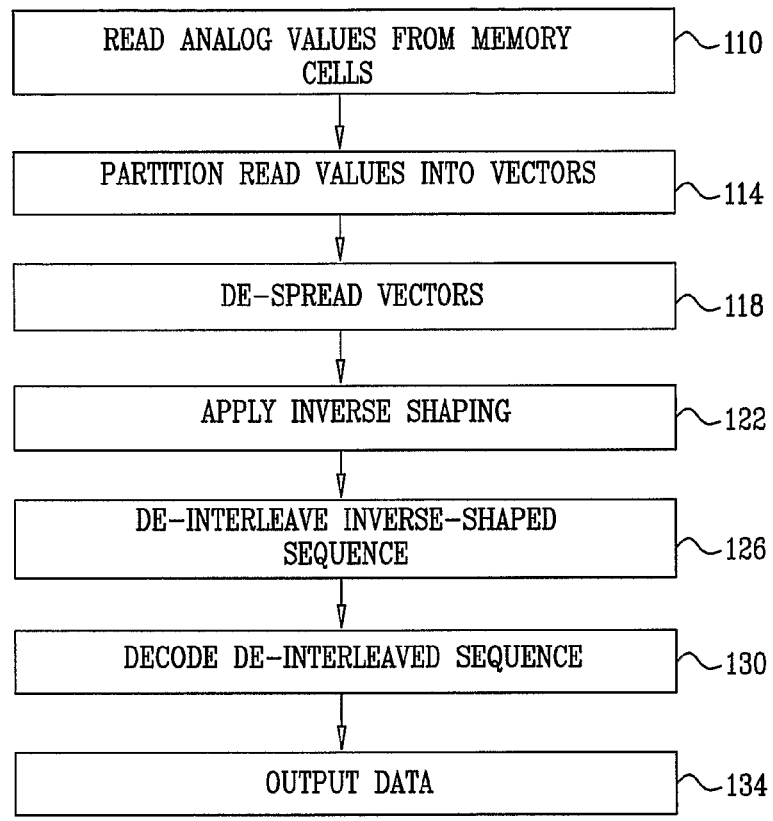
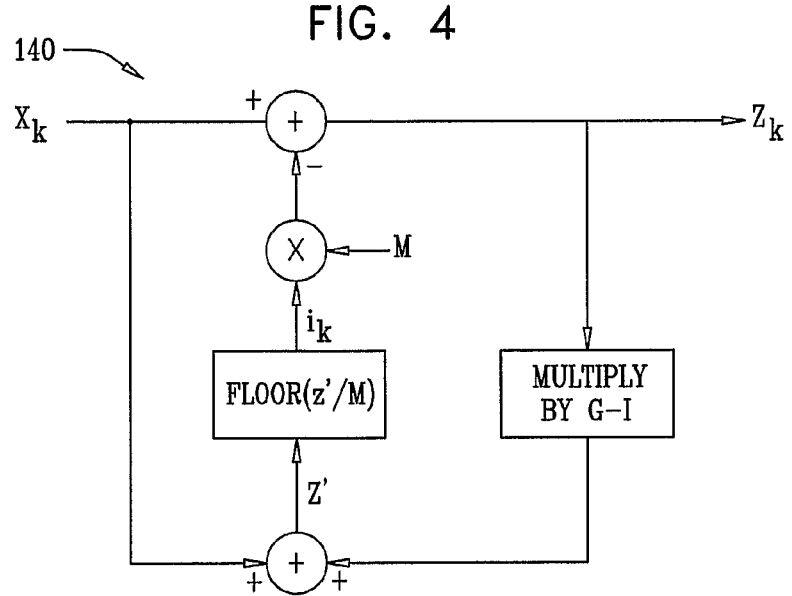

MEMORY DEVICE PROGRAMMING USING COMBINED SHAPING AND LINEAR SPREADING

CROSS-REFERENCE TO RELATED APPLICATIONS

This application is the U.S. national phase of PCT Application No. PCT/IL2007/000581, filed May 10, 2007, and published in English on Nov. 22, 2007, which claims the benefit of U.S. Provisional Patent Application 60/747,106, filed May 12, 2006, U.S. Provisional Patent Application 60/822,236, filed Aug. 13, 2006, and U.S. Provisional Patent Application 60/867,399, filed Nov. 28, 2006, whose disclosures are incorporated herein by reference.

FIELD OF THE INVENTION

The present invention relates generally to memory devices, and particularly to methods and systems for storing data in analog memory cells.

BACKGROUND OF THE INVENTION

Several types of memory devices, such as Flash memories and Dynamic Random Access Memory (DRAM), use arrays of analog memory cells for storing data. Flash memory devices are described, for example, by Bez et al., in "Introduction to Flash Memory," Proceedings of the IEEE, volume 91, number 4, April, 2003, pages 489-502, which is incorporated herein by reference.

In such memory devices, each analog memory cell typically comprises a transistor, which holds a certain amount of electric charge that represents the information stored in the cell. The electric charge written into a particular cell influences the "threshold voltage" of the cell, i.e., the voltage that needs to be applied to the cell so that the cell will conduct current.

Some memory devices, commonly referred to as Single-Level Cell (SLC) devices, store a single bit of information in each memory cell. Typically, the range of possible threshold voltages of the cell is divided into two regions. A voltage value falling in one of the regions represents a "0" bit value, and a voltage belonging to the second region represents "1". Higher-density devices, often referred to as Multi-Level Cell (MLC) devices, store two or more bits per memory cell. In multi-level cells, the range of threshold voltages is divided into more than two regions, with each region representing more than one bit.

Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference.

Other exemplary types of analog memory cells are Ferroelectric RAM (FRAM) cells, magnetic RAM (MRAM) cells and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

In some data storage methods, the data is transformed using an orthogonal transformation prior to storing the data in the memory cells. U.S. Pat. Nos. 6,397,364 and 6,467,062, whose disclosures are incorporated herein by reference, describe the use of orthogonal transformation methods such as Fast Fourier Transforms (FFT), Discrete Fourier Transforms (DFT), Discrete Cosine Transforms (DCT), Fast Hartley Transforms (FHT), wavelet transforms, Chebyshev polynomials and Fractals.

SUMMARY OF THE INVENTION

Embodiments of the present invention provide a method for data storage, including:

accepting data for storage in a memory that includes multiple analog memory cells;

converting the data to input values;

filtering the input values using a non-linear filtering operation to produce respective shaped values and converting the shaped values to output values using a linear spreading transformation with coefficients chosen so that each of the shaped values contributes to at least two of the output values, wherein the non-linear filtering operation is selected so as to reduce a size of an output range in which the output values lie; and storing the output values in the respective analog memory cells.

In some embodiments, the linear spreading transformation is represented by a spreading matrix, the input values lie within an input range, and the non-linear filtering operation is selected so as to minimize the size of the output range. Filtering the input values may include subtracting from the input values respective integer multiples of the size of the input range to produce the shaped values.

In another embodiment, the linear spreading transformation is represented by a spreading matrix having a determinant value of unity. In yet another embodiment, the linear spreading transformation is represented by a spreading matrix, and converting the shaped values to the output values includes formatting the shaped values into input vectors and multiplying the input vectors by the spreading matrix to produce respective output vectors including the output values.

In a disclosed embodiment, the linear spreading transformation is represented by a Toeplitz matrix having main diagonal elements that are equal to unity. The linear spreading transformation may include a linear monic filtering transformation. In still another embodiment, the linear spreading transformation is represented by a matrix whose elements include coefficients of a two-dimensional transform.

In some embodiments, encoding the data includes encoding the data using an Error Correction Code (ECC).

In an embodiment, the method includes reconstructing the data stored in the analog memory cells by:

reading the output values from the respective analog memory cells;

reproducing the shaped values from the read output values;

applying an inverse of the non-linear filtering operation to the reproduced shaped values to reproduce the input values; and reproducing the data based on the reproduced input values.

In a disclosed embodiment, converting the data includes encoding the data using an Error Correction Code (ECC), and reproducing the data includes decoding the ECC.

Reproducing the shaped values may include applying an inverse of the linear spreading transformation to the read output values. Alternatively, reproducing the shaped values may include applying a detection process to detect the shaped values responsively to the read output values.

The method may include interleaving the input values before converting the input values to the shaped values, and de-interleaving the reproduced input values before decoding the data.

There is also provided, in accordance with an embodiment of the present invention, a data storage apparatus, including:

an interface, which is operative to communicate with a memory that includes multiple analog memory cells; and a Memory Signal Processor (MSP), which is coupled to the interface and is arranged to accept data for storage in the memory, to convert the data to input values, to filter the input values using a non-linear filtering operation to produce respective shaped values and to convert the shaped values to output values using a linear spreading transformation with coefficients chosen so that each of the shaped values contributes to at least two of the output values, wherein the non-linear filtering operation is selected so as to reduce a size of an output range in which the output values lie, and to store the output values in the respective analog memory cells.

There is additionally provided, in accordance with an embodiment of the present invention, a data storage apparatus, including:

a memory, which includes multiple analog memory cells; and a Memory Signal Processor (MSP), which is coupled to the memory and is arranged to accept data for storage in the memory, to convert the data to input values, to filter the input values using a non-linear filtering operation to produce respective shaped values and to convert the shaped values to output values using a linear spreading transformation with coefficients chosen so that each of the shaped values contributes to at least two of the output values, wherein the non-linear filtering operation is selected so as to reduce a size of an output range in which the output values lie, and to store the output values in the respective analog memory cells.

The present invention will be more fully understood from the following detailed description of the embodiments thereof, taken together with the drawings in which:

BRIEF DESCRIPTION OF THE DRAWINGS

FIG. 2 is a flow chart that schematically illustrates a method for storing data in a memory device, in accordance with an embodiment of the present invention;

FIG. 3 is a flow chart that schematically illustrates a method for retrieving data from a memory device, in accordance with an embodiment of the present invention; and FIG. 4 is a block diagram that schematically illustrates a non-linear shaping circuit, in accordance with an embodiment of the present invention.

DETAILED DESCRIPTION OF EMBODIMENTS

OVERVIEW

Figure 1:
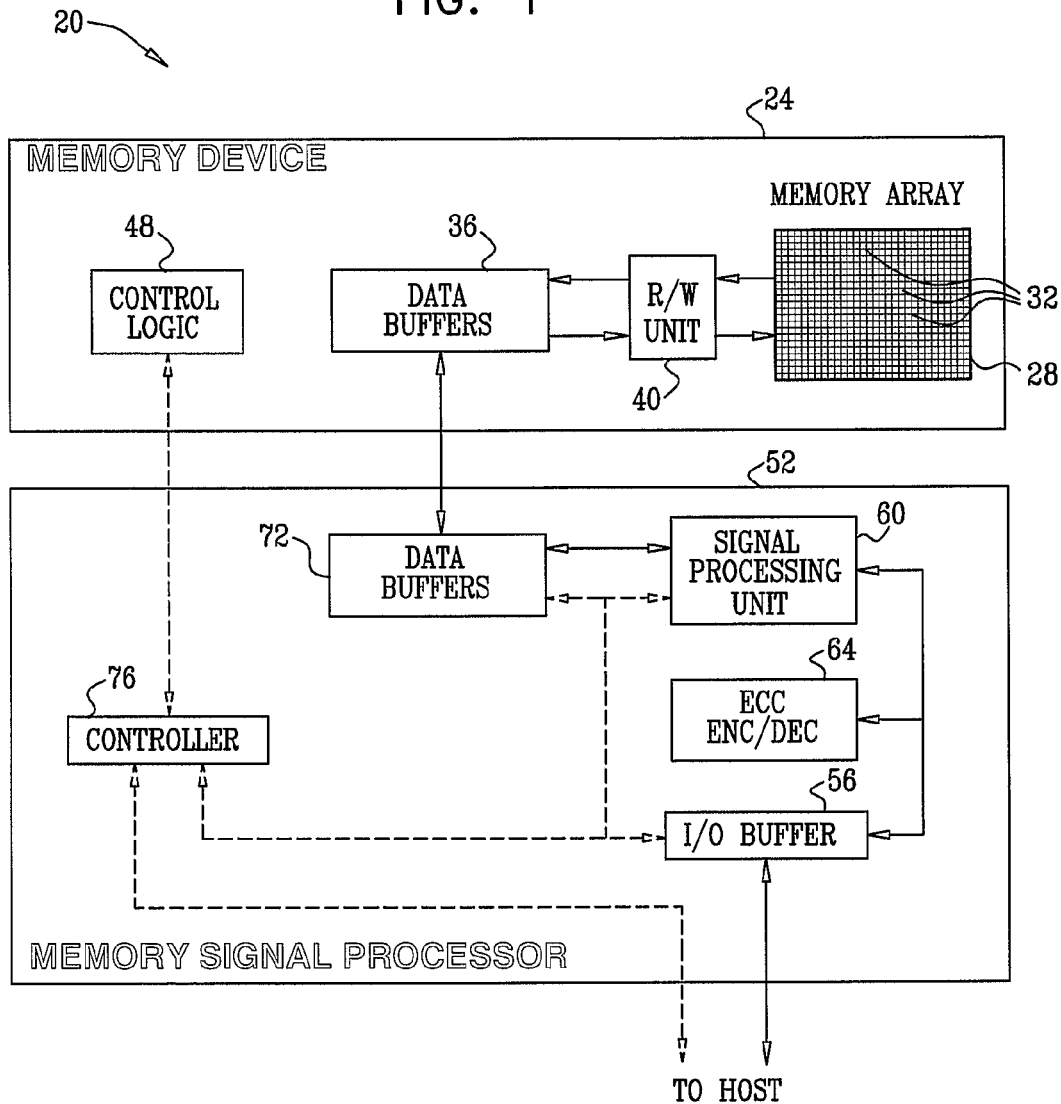
FIG. 1 is a block diagram that schematically illustrates a system for memory signal processing, in accordance with an embodiment of the present invention.

Some distortion effects in arrays of analog memory cells have impulsive characteristics, i.e., a distribution that is extremely non-uniform across the array. Impulsive distortion occurs, for example, when certain memory cells have manufacturing defects or high leakage currents.

Embodiments of the present invention provide methods and systems for storing data in arrays of analog memory cells and retrieving data from such arrays, while reducing the effects of impulse distortion.

Data is stored in the analog memory cells by programming each cell with an analog value, typically an analog voltage, which is stored in the cell as an electrical charge level or other analog physical quantity. In the embodiments that are described herein, a Memory Signal Processor (MSP) is coupled to a memory, which comprises an array of multiple analog memory cells. The MSP produces digital samples, which are converted to respective analog values programmed to the memory cells. The MSP often encodes the data using an Error Correcting Code (ECC) before generating the digital samples.

In order to reduce the effects of impulse distortion, the MSP applies a linear spreading transformation to the digital samples before they are converted to the analog values and written to the memory cells. The linear spreading transformation causes each input value to be distributed, or spread, among multiple values at its output. Each output value produced by the spreading transformation usually comprises components originating from multiple input values. Thus, when the output values produced by the spreading transformation are written to the memory cells, each input value is distributed over multiple memory cells.

When reading the memory cells, analog values (e.g., cell threshold voltages) are read and digitized to produce respective digital samples. The MSP applies a de-spreading transformation to the read digital samples. The de-spreading transformation reconstructs the original values that were input to the spreading transformation, by combining the components of each original input value from the multiple memory cells over which it was spread. Consequently, when impulse distortion is present in a particular memory cell or group of cells, the distortion is distributed among multiple reconstructed input values. The residual distortion in any single reconstructed input value is relatively small and is corrected by the decoding process, such as by the ECC. In some embodiments, the MSP interleaves the input values before applying the linear spreading transformation and de-interleaves the reconstructed input values produced by the de-spreading transformation.

In many cases, however, the linear spreading transformation increases the Peak to Average Ratio (PAR), i.e., the ratio between the maximum and average values, of the output values, and thus the PAR of the analog values written to the memory cells. Increasing the PAR is highly undesirable. For example, in some memory devices high PAR values cause a considerable reduction in programming speed, degrade the achievable Signal to Noise Ratio (SNR) in the analog values stored in the memory cells and increase the likelihood of programming disturb events (disturbance to memory cells caused by reading or programming other cells in the array).

In order to enable the use of a linear spreading transformation without increasing the PAR of the analog values written to the memory cells, the MSP shapes the input values before applying the linear spreading transformation. The MSP filters the input values using a non-linear filtering operation, which is described in greater detail below. The values produced by the non-linear filtering operation are referred to as filtered or shaped values. The linear spreading transformation thus spreads the shaped values produced by the non-linear filtering operation. The non-linear filtering operation is selected such that the dynamic range, or PAR, of the output values produced by the spreading transformation is reduced.

The joint design of the linear spreading transformation and the preceding non-linear filtering operation enables efficient mitigation of impulse distortion, while avoiding the performance degradation caused by increased PAR in the analog values written to the memory cells. Moreover, combining the linear spreading transformation with the non-linear filtering operation enables the use of non-orthogonal spreading transformations, which further improve the SNR of the stored analog values.

Thus, the methods and systems described herein can be used to increase the reliability of storing data in memory devices that are affected by impulse distortion, to increase the storage capacity and/or to reduce the cost of such devices.

SYSTEM DESCRIPTION

FIG. 1 is a block diagram that schematically illustrates a system 20 for memory signal processing, in accordance with an embodiment of the present invention. System 20 can be used in various host systems and devices, such as in computing devices, cellular phones or other communication terminals, removable memory modules (e.g., "disk-on-key" devices), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND and NOR Flash cells, PCM, NROM, FRAM, MRAM and DRAM cells. The charge levels stored in the cells and/or the analog voltages written into and read out of the cells are referred to herein collectively as analog values.

Data for storage in memory device 24 is provided to the device and cached in data buffers 36. The data is then converted to analog voltages and written into memory cells 32 using a reading/writing (R/W) unit 40, whose functionality is described in greater detail below. When reading data out of array 28, unit 40 converts the electric charge, and thus the analog voltages of memory cells 32, into digital samples. The samples are cached in buffers 36. The samples produced by unit 40 are referred to as soft samples. The operation and timing of memory device 24 is managed by control logic 48.

The storage and retrieval of data in and out of memory device 24 is performed by a Memory Signal Processor (MSP) 52. As will be shown in detail hereinbelow, MSP 52 uses novel methods for reducing the effect of impulse distortion on the storage performance.

In some embodiments, MSP 52 comprises an encoder/decoder 64, which encodes the data to be written to device 24 using an ECC and decodes the ECC when reading data out of device 24. A signal processing unit 60 processes the data that is written into and retrieved from device 24. In particular, unit 60 applies the linear spreading and de-spreading transformations, the non-linear filtering operations and the interleaving and de-interleaving operations described herein.

MSP 52 comprises a data buffer 72, which is used by unit 60 for storing data and for interfacing with memory device 24. MSP 52 also comprises an Input/Output (I/O) buffer 56, which forms an interface between the MSP and the host. A controller 76 manages the operation and timing of MSP 52. Signal processing unit 60 and controller 76 may be implemented in hardware. Alternatively, unit 60 and/or controller 76 may comprise microprocessors that run suitable software, or a combination of hardware and software elements.

The configuration of FIG. 1 is an exemplary system configuration, which is shown purely for the sake of conceptual clarity. Any other suitable configuration can also be used. Elements that are not necessary for understanding the principles of the present invention, such as various interfaces, addressing circuits, timing and sequencing circuits, data scrambling circuits and debugging circuits, have been omitted from the figure for clarity.

In the exemplary system configuration shown in FIG. 1, memory device 24 and MSP 52 are implemented as two separate Integrated Circuits (ICs). In alternative embodiments, however, the memory device and MSP may be integrated in a single IC or System on Chip (SoC). In some implementations, a single MSP 52 may be connected to multiple memory devices 24. Further alternatively, some or all of the functionality of MSP 52 can be implemented in software and carried out by a processor or other element of the host system. Additional architectural aspects of certain embodiments of system 20 are described in greater detail in U.S. Provisional Patent Application 60/867,399, cited above.

DATA PROGRAMMING AND RETRIEVAL METHODS

FIG. 2 is a flow chart that schematically illustrates a method for storing data in memory device 24, in accordance with an embodiment of the present invention. The method begins with MSP 52 accepting data for storage in memory device 24, at a data input step 80.

The MSP encodes the data using a suitable ECC, at an encoding step 84. The MSP can use various types of error correcting codes known in the art for encoding the data. The ECC may comprise, for example, a block code such as a Bose-Chaudhuri-Hochquenghem (BCH) code, a Reed-Solomon (RS) code, a Low-Density Parity Check (LDPC) code, a turbo-code or a Turbo Product Codes (TPC), a convolutional code, a Trellis-Coded Modulation (TCM) code, a Bit Interleaved Coded Modulation (BICM) code, a concatenated code or any other suitable ECC.

The MSP converts the encoded data into digital samples, also referred to as input values. The input values are typically selected from a set of discrete possible values. In some embodiments, MSP 52 interleaves the input values (i.e., permutates the relative positions of the input values), at an interleaving step 88.

At steps 92-104 below, the MSP applies a non-linear filtering (shaping) operation followed by a linear spreading transformation to the encoded and interleaved input values. For ease of explanation, however, the linear spreading transformation is described first.

The linear spreading transformation accepts as input a sequence of shaped values (filtered by the non-linear filtering operation, which will be described further below) and produces a sequence of output values. The transformation spreads each shaped value among multiple output values.

Typically, therefore, each output value comprises a weighted sum of multiple shaped values. Thus, when the output values produced by the spreading transformation are subsequently converted to analog values and written to the memory cells, each shaped value is distributed over multiple memory cells.

In some embodiments, the linear spreading transformation is represented by a matrix, referred to as a spreading matrix. In these embodiments, the MSP applies the spreading transformation by partitioning the sequence of shaped values into input vectors, at a spread partitioning step 96, and multiplying each input vector by the spreading matrix, at a spreading step 100.

The multiplication operation produces an output vector for each respective input vector. The matrix elements are designed such that each element of the input vector (i.e., each shaped value) is spread among multiple different elements of the output vector. In some embodiments, the spreading matrix has a determinant value that is equal to unity.

The elements of the output vectors (i.e., the output values of the spreading transformation) are converted to respective analog values and written into respective analog memory cells 32 using R/W unit 40, at a programming step 104. Thus, each shaped value is spread over multiple analog memory cells.

Various types of matrices can be used as spreading matrices. For example, the matrix may comprise an upper diagonal or lower diagonal Toeplitz matrix, whose main diagonal elements are equal to unity. Such a matrix represents a linear monic causal filtering operation. As another example, the matrix elements may comprise elements of a two-dimensional transform, such as a Discrete Fourier Transform (DFT), a Discrete Cosine Transform (DCT) or a Discrete Hartley transform (DHT). Typically, such coefficients comprise trigonometric functions whose phases are proportional to the row and column indices of the coefficients. The transform coefficients are typically scaled by a constant in order to cause the determinant of the matrix to equal unity.

In alternative embodiments, MSP 52 can apply a linear spreading transformation of any other suitable type, either using matrix multiplication or using any other suitable means.

The linear spreading transformation improves the robustness of the data storage process in the presence of impulse distortion that affects single cells or relatively small groups of cells, since the transformation spreads each analog value over multiple memory cells.

On the other hand, the spreading transformation often increases the Peak to Average Ratio (PAR), i.e., the ratio between the maximum and average values, of the output values, and thus the PAR of the analog values that are written into the memory cells. The effect of linear transformations on PAR is described, in the context of communication signals, by Shalvi et al., in "Signal Codes," the 2003 IEEE Information Theory Workshop (ITW'2003), Paris, France, Mar. 31-Apr. 4, 2003, which is incorporated herein by reference.

Increasing the PAR of the analog values written to the memory cells is highly undesirable. For example, in some memory devices high PAR values cause a considerable reduction in programming speed, degrade the achievable Signal to Noise Ratio (SNR) in the analog values stored in the memory cells and increase the likelihood of programming disturb events (disturbance to memory cells caused by reading or programming other cells in the array).

In order to enable the use of a linear spreading transformation without increasing the PAR of the analog values written to the memory cells, the MSP shapes the digital samples processed by the linear spreading transformation, at a shaping step 92. The MSP filters the input values using a non-linear filtering operation, to produce respective shaped values. The non-linear filtering operation is selected such that the PAR of the output values produced by the spreading transformation is reduced.

An exemplary non-linear filtering (shaping) operation, and an exemplary block diagram of a shaping circuit that carries out this operation, are described in FIG. 4 further below. When the input values are selected from a set of equally-spaced values that are confined to a certain range, the shaping operation shown in FIG. 4 converts the input values to respective shaped values that are taken from the same grid as the input values. Assuming the determinant of the spreading matrix equals unity, when the spreading matrix operates on the shaped values, the resulting output values are confined to the same range as the range of the input values. Thus, the PAR increase caused by the spreading transformation is substantially compensated for by the non-linear filtering operation.

FIG. 3 is a flow chart that schematically illustrates a method for retrieving data that was stored using the method of FIG. 2 above, in accordance with an embodiment of the present invention. The method begins with R/W unit 40 reading and digitizing the analog values from memory cells 32, at a reading step 110.

The linear spreading transformation generally produces output values that are continuous in nature, i.e., are not selected from a certain discrete set of values and do not necessarily lie of a regular grid. Therefore, the analog values are typically read from the memory cells as soft samples, such as using a high-resolution Analog to Digital Converter (ADC).

MSP 52 accepts the digitized analog values and applies a de-spreading transformation to the read values. The de-spreading transformation is an inverse of the spreading transformation applied at spreading step 100 of FIG. 2 above. In some embodiments, the MSP partitions the read digitized values into vectors, at a de-spread partitioning step 114. The MSP then multiplies each vector by an inverse of the spreading matrix that was used for spreading the data, at a de-spreading step 118. When the spreading matrix is unitary, the inverse matrix is equal to the transpose of the spreading matrix, and the autocorrelation of the de-spread values is not changed.

In alternative embodiments, the MSP can perform de-spreading by applying a decoding process that detects the de-spread values. For example, the MSP may comprise a sequential decoder that scans the digitized read values sequentially. Alternatively, the MSP can scan and decode the digitized read values twice in opposite directions, in a process that is commonly referred to as bidirectional decoding.

The MSP applies an inverse of the non-linear filtering operation, at an inverse shaping step 122. An exemplary inverse shaping operation is described in FIG. 4 below. The MSP de-interleaves the inverse-shaped values, at a de-interleaving step 126, assuming interleaving was used when the data was stored.

The MSP decodes the inverse-shaped (and potentially de-interleaved) values, in order to reconstruct the data, at a decoding step 130. In particular, the MSP decodes the ECC used in the storage process. The MSP outputs the data to the host, at an output step 134.

EXEMPLARY NON-LINEAR SHAPING OPERATION

FIG. 4 is a block diagram that schematically illustrates a non-linear shaping circuit 140, in accordance with an embodiment of the present invention. The non-linear filtering operation carried out by circuit 140 can be used in shaping step 92 of the method of FIG. 2 above.

The non-linear filtering operation carried out by circuit 140 is designed to operate in conjunction with an N-by-N lower-diagonal spreading matrix denoted G. The elements along the main diagonal of G are assumed to equal unity.

Input values denoted $x_k$, typically comprising encoded and interleaved values, are provided as input to the shaping circuit. In the present example, input values $x_k$ can take M possible equally-spaces values selected from the set {0.5, 1.5, 2.5, 3.5, ..., M−0.5}. The shaping circuit produces shaped values denoted $z_k$. The non-linear operation performed by circuit 140 can be written as $$z_k = x_k - M \cdot i_k$$

$$i_k = \mathrm{Floor}\left[\frac{\sum_{l=1}^{k-1} G_{k1} \cdot z_l + x_k}{M}\right]$$

wherein $G_{kl}$ denote the elements of spreading matrix G, and Floor[x] denotes the largest integer value that is smaller than or equal to x.

In other words, the non-linear filtering operation of circuit 140 subtracts from each input value $x_k$ an integer multiple of M, such that the values of shaped values $z_k$ all lie on the same grid as the values of input values $x_k$, i.e., from the grid [..., −1.5, −0.5, 0.5, 1.5, ...]. As shown in the article by Shalvi et al., cited above, when matrix G spreads shaped values $z_k$, the spreaded output values are confined to the interval [0,M], assuming the determinant value of the spreading matrix is equal to unity.

When the determinant value of the spreading matrix, denoted |G|, is not equal to unity, the non-linear filtering operation causes the output values produced by the spreading transformation to fall within the interval $[0M|G|^{1/N}]$.

When the input values are shaped using the non-linear filtering operation of FIG. 4, the MSP can perform inverse-shaping of the values read from the memory cells by calculating $\tilde{x}_k = \tilde{z}_k \bmod M$, wherein $\tilde{z}_k$ and $\tilde{x}_k$ denote the de-spreaded values and the corresponding inverse-shaped values, respectively. mod stands for the modulo operator, i.e., X mod M=X−M·Floor(X/M).

The methods and systems described herein can be used in various types of analog memory cells, such as, for example, NAND and NOR Flash cells, PCM, NROM, FRAM, MRAM and DRAM cells. Although the embodiments described herein mainly address retrieving data from solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
accepting data for storage in a memory that includes multiple analog memory cells;
converting the data to input values;
filtering the input values using a non-linear filtering operation to produce respective shaped values and converting the shaped values to output values using a linear spreading transformation with coefficients chosen so that each of the shaped values contributes to at least two of the output values, wherein the non-linear filtering operation is selected so as to reduce a size of an output range in which the output values lie; and
storing the output values in the respective analog memory cells.

2. The method according to claim 1, wherein the linear spreading transformation is represented by a spreading matrix, wherein the input values lie within an input range, and wherein the non-linear filtering operation is selected so as to minimize the size of the output range.

3. The method according to claim 2, wherein filtering the input values comprises subtracting from the input values respective integer multiples of the size of the input range to produce the shaped values.

4. The method according to claim 1, wherein the linear spreading transformation is represented by a spreading matrix having a determinant value of unity.

5. The method according to claim 1, wherein the linear spreading transformation is represented by a spreading matrix, and wherein converting the shaped values to the output values comprises formatting the shaped values into input vectors and multiplying the input vectors by the spreading matrix to produce respective output vectors comprising the output values.

6. The method according to claim 1, wherein the linear spreading transformation is represented by a Toeplitz matrix having main diagonal elements that are equal to unity.

7. The method according to claim 1, wherein the linear spreading transformation comprises a linear monic filtering transformation.

8. The method according to claim 1, wherein the linear spreading transformation is represented by a matrix whose elements comprise coefficients of a two-dimensional transform.

9. The method according to claim 1, wherein converting the data comprises encoding the data using an Error Correction Code (ECC).

10. The method according to claim 1, and comprising reconstructing the data stored in the analog memory cells by:
reading the output values from the respective analog memory cells;
reproducing the shaped values from the read output values;
applying an inverse of the non-linear filtering operation to the reproduced shaped values to reproduce the input values; and
reproducing the data based on the reproduced input values.

11. The method according to claim 10, wherein converting the data comprises encoding the data using an Error Correction Code (ECC), and wherein reproducing the data comprises decoding the ECC.

12. The method according to claim 10, wherein reproducing the shaped values comprises applying an inverse of the linear spreading transformation to the read output values.

13. The method according to claim 10, wherein reproducing the shaped values comprises applying a detection process to detect the shaped values responsively to the read output values.

14. The method according to claim 10, and comprising interleaving the input values before converting the input values to the shaped values, and deinterleaving the reproduced input values before decoding the data.

15. A data storage apparatus, comprising:
- an interface, which is operative to communicate with a memory that includes multiple analog memory cells; and
- a Memory Signal Processor (MSP), which is coupled to the interface and is arranged to accept data for storage in the memory, to convert the data to input values, to filter the input values using a non-linear filtering operation to produce respective shaped values and to convert the shaped values to output values using a linear spreading transformation with coefficients chosen so that each of the shaped values contributes to at least two of the output values, wherein the non-linear filtering operation is selected so as to reduce a size of an output range in which the output values lie, and to store the output values in the respective analog memory cells.

16. The apparatus according to claim 15, wherein the linear spreading transformation is represented by a spreading matrix, wherein the input values lie within an input range, and wherein the nonlinear filtering operation is selected so as to minimize the size of the output range.

17. The apparatus according to claim 15, wherein the MSP is arranged to filter the input values by subtracting from the input values respective integer multiples of the size of the input range to produce the shaped values.

18. The apparatus according to claim 15, wherein the linear spreading transformation is represented by a spreading matrix having a determinant value of unity.

19. The apparatus according to claim 15, wherein the linear spreading transformation is represented by a spreading matrix, and wherein the MSP is arranged to format the shaped values into input vectors and to multiply the input vectors by the spreading matrix to produce respective output vectors comprising the output values.

20. The apparatus according to claim 15, wherein the linear spreading transformation is represented by a Toeplitz matrix having main diagonal elements that are equal to unity.

21. The apparatus according to claim 15, wherein the linear spreading transformation comprises a linear monic filtering transformation.

22. The apparatus according to claim 15, wherein the linear spreading transformation is represented by a matrix whose elements comprise coefficients of a two-dimensional transform.

23. The apparatus according to claim 15, wherein the MSP is arranged to encode the data using an Error Correction Code (ECC).

24. The apparatus according to claim 15, wherein the MSP is arranged to reconstruct the data stored in the analog memory cells by:
- reading the output values from the respective analog memory cells;
- reproducing the shaped values from the read output values;
- applying an inverse of the non-linear filtering operation to the reproduced shaped values to reproduce the input values; and
- reproducing the data based on the reproduced input values.

25. The apparatus according to claim 24, wherein the MSP is arranged to encode the data using an Error Correcting Code (ECC), and to decode the ECC when reproducing the data.

26. The apparatus according to claim 24, wherein the MSP is arranged to apply an inverse of the linear spreading transformation to the read output values, so as to reproduce the shaped values.

27. The apparatus according to claim 24, wherein the MSP is arranged to apply a detection process to detect the shaped values responsively to the read output values.

28. The apparatus according to claim 24, wherein the MSP is arranged to interleave the input values before converting the input values to the shaped values, and to de-interleave the reproduced input values before decoding the data.

29. A data storage apparatus, comprising:
- a memory, which comprises multiple analog memory cells; and
- a Memory Signal Processor (MSP), which is coupled to the memory and is arranged to accept data for storage in the memory, to convert the data to input values, to filter the input values using a non-linear filtering operation to produce respective shaped values and to convert the shaped values to output values using a linear spreading transformation with coefficients chosen so that each of the shaped values contributes to at least two of the output values, wherein the non-linear filtering operation is selected so as to reduce a size of an output range in which the output values lie, and to store the output values in the respective analog memory cells.

* * * * *